United States Patent [19]

Grivna

[11] Patent Number: 4,851,710
[45] Date of Patent: Jul. 25, 1989

[54] METASTABLE PREVENT CIRCUIT

[75] Inventor: Edward L. Grivna, Brooklyn Park, Minn.

[73] Assignee: Magnetic Peripherals Inc., Minneapolis, Minn.

[21] Appl. No.: 174,641

[22] Filed: Mar. 29, 1988

[51] Int. Cl.[4] .................. H03K 17/18; H03K 19/03
[52] U.S. Cl. .................. 307/269; 307/480; 307/289; 328/63; 377/66
[58] Field of Search .............. 307/269, 480, 289; 328/72, 75, 63; 377/66, 75, 76

[56] References Cited

U.S. PATENT DOCUMENTS

| | | | |
|---|---|---|---|
| 3,894,246 | 7/1975 | Torgrim | 307/269 |
| 4,093,878 | 6/1978 | Paschal et al. | 307/291 |
| 4,398,155 | 8/1983 | Atwell et al. | 307/480 |
| 4,498,176 | 2/1985 | Wagner | 307/480 |
| 4,544,851 | 10/1985 | Conrad et al. | 307/480 |
| 4,575,644 | 3/1986 | Leslie | 307/291 |
| 4,591,737 | 5/1986 | Campbell | 307/272.2 |
| 4,622,475 | 11/1986 | Whitely | 307/289 |
| 4,694,196 | 9/1987 | Hasley et al. | 328/63 |
| 4,745,302 | 5/1988 | Hanawa et al. | 307/269 |
| 4,771,441 | 9/1988 | Spengler et al. | 307/269 |

Primary Examiner—John S. Heyman
Attorney, Agent, or Firm—J. A. Genovese; R. M. Angus

[57] ABSTRACT

A metastable prevent circuit comprises a plurality of parallel channels, each coupled to receive and synchronize asynchronous pulses to a synchronous clock signal. A shift register is responsive to the asynchronous pulses to sequentially enable individual ones of the channels. In the case of a two-channel system, the shift register is a bistable device which enables the channels alternately.

24 Claims, 6 Drawing Sheets

METASTABLE PREVENT CIRCUIT

This invention relates to a circuit for eliminating the effects of metastable conditions in a digital circuit.

Digital latches and flip-flops respond to input signals to either remain in, or reverse, the output state. In either case, the output state is a stable condition. However, a condition known as metastability can exist in which the latch or flip-flop reaches a condition in which it lingers indefinitely between the two stable states. Ordinarily, this condition is caused by marginal triggering. If the flip-flop is well balanced, the metastable condition may last until such internal or external imbalances affect the flip-flop to cause it to go to one of its two stable states. While in a metastable condition, the output of the flip-flop cannot be safely clocked. Consequently, metastability is a serious problem in high-speed digital circuits used for synchronization of asynchronous signals. More particularly, metastability is a significant problem in data recovery circuits employed in computer peripheral devices. In the past, attempts to prevent metastability have employed paired flip-flop circuits in which the output of a first flip-flop is clocked into a second. If the first flip-flop goes into a metastable state, it will hopefully recover in time for its output to be clocked into the second flip-flop. However, due to signal degradation in transmission of asynchronous information signals, the information may not be present at a time adequate to clock into the first flip-flop. As a result, although the clocking of the second flip-flop is intended to recover the information, the circuit might not respond to a badly degraded asynchronous signal. Consequently, an improvement of the prior art has been to employ a pulse edge detector ahead of the first flip-flop to more accurately define the signal for the first flip-flop. While these efforts have met with some degree of success in overcoming metastable conditions in digital recovery circuits, they have not been completely successful at the reliability and speeds of current systems.

It is an object of the present invention to provide a circuit which eliminates the effects of metastability.

A metastable prevent circuit according to the present invention comprises a plurality of parallel channels, each coupled to receive and synchronize asynchronous pulses to a synchronous clock signal. A shift register is responsive to the asynchronous pulses to sequentially enable individual ones of the channels.

In carrying out the present invention, two parallel channels, substantially identical to each other, each comprise a pair of flip-flops, coupled with a pulse edge detector, as in prior systems. However, the present invention further employs a shift register driven by the asynchronous signal to permit the parallel channels to process successive, alternate asynchronous pulses In the case of a two channel circuit, the shift register may be a two position shift register (i.e., a bistable multivibrator or flip-flop), which will enable the channels alternately. The channels thus independently receive and process half the asynchronous data, thereby eliminating the effects of metastable conditions.

One feature of the present invention resides in the fact that metastability is eliminated because each channel is enabled and is clocked to recovery before the next asynchronous data pulse is received for processing on that channel.

Another feature of the present invention resides in the fact the system is easily expanded for additional parallel channels operating off additional positions of an expanded shift register, thereby providing greater time periods for recovery of each channel.

The above and other features of this invention will be more fully understood from the following detailed description, and the accompanying drawings, in which.

Figure 1:
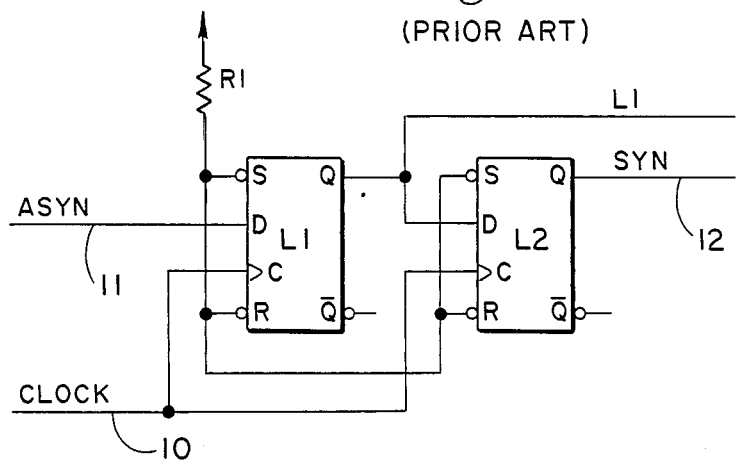
FIG. 1 is a block diagram of a typical metastable prevent circuit employed in the prior art.
Figure 2:
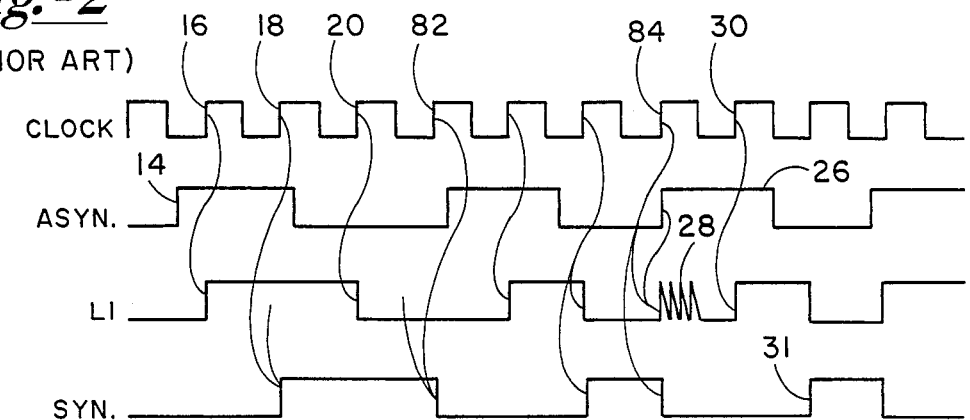
FIG. 2 is a diagram of waveforms useful in explaining the operation of the apparatus illustrated in FIG. 1.

Referring to the drawings, and particularly to FIG. 1, there is illustrated a typical metastable prevent circuit in accordance with the prior art. The metastable prevent circuit employs a pair of D-type flip-flops L1 and L2, having their set and reset inputs connected through resistor R1 to a source of potential. The clock inputs of both flip-flops receive the synchronous clock signal via lead 10, while the asynchronous data signal is provided to the D input of flip-flop L1. The Q output of flip-flop L1 is provided to the D input of flip-flop L2, and the synchronous data signal is provided at the Q output 12 of flip-flop L2. The asynchronous signal may contain or validate digital information or may, itself, be an asynchronous clock signal. With reference to FIG. 2, the operation of the prior art circuit illustrated in FIG. 1 may be easily explained. Upon receipt of an asynchronous pulse 14, the D input of flip-flop L1 goes high. Upon the next rising edge 16 of the clock signal on lead 10, the Q output of flip-flop L1 is forced high, thereby providing a high input to the D input of flip-flop L2. Upon the next rising edge 18 of the clock signal, flip-flop L2 is forced to provide a high output, as shown. Flip-flop L1 is forced low upon the rising edge 20 of the next clock pulse after the asynchronous pulse 14 goes low, and the synchronous output signal is forced low upon the rising edge 22 of the next clock pulse after flip-flop L1 goes low. Referring particularly to clock pulse 24 and asynchronous pulse 26, these two pulses have their leading edges occurring at approximately the same time, causing a marginal triggering of flip-flop L1. As a result, flip-flop L1 enters a metastable state resulting in a non-standard logic level, such as rapid switching between two stable states of the flip-flop, as illustrated at signal 28. Eventually, circuit imbalances and other external factors will force the flip-flop L1 to arbitrarily seek one of its two stable states. If flip-flop L1 falsely seeks its lower state as shown in FIG. 2, the next leading edge 30 of the clock signal (with the asynchronous pulse 26 still high) will force L1 to its high or true condition, thereby establishing the synchronous data pulse 31.

Figure 3:
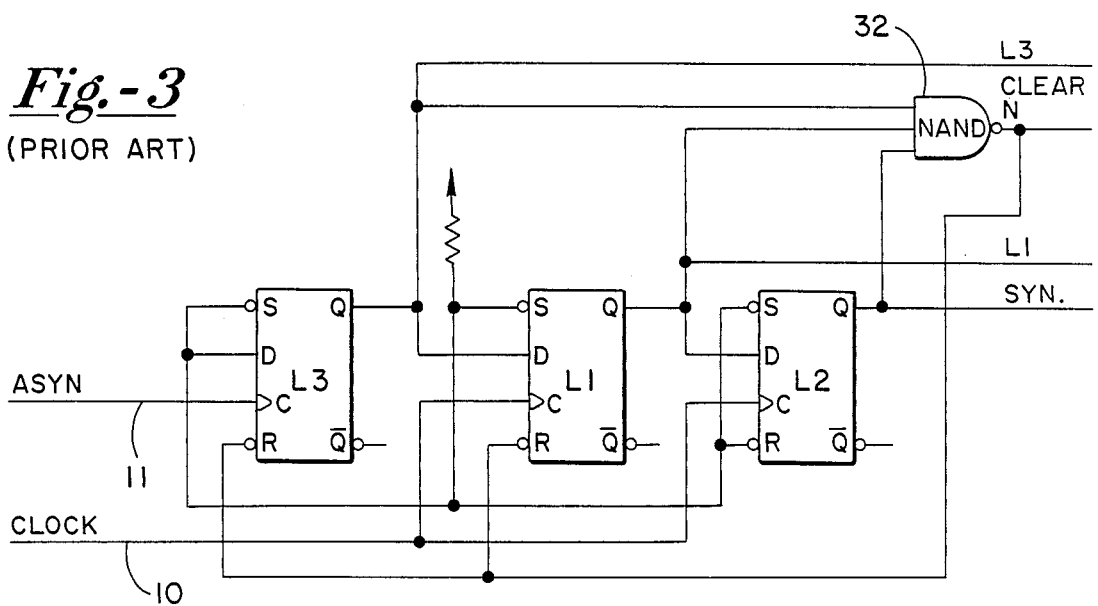
FIG. 3 is a block circuit diagram of an improved metastable prevent circuit as employed in the prior art.

In most computer designs, the reliance on asynchronous logic is maintained at a minimum and is generally located at interfaces between separate equipments. In most cases, these interfaces are separated by relatively short distances. However, when signals are transmitted over substantial distances, distortion may result. The distortion may result in pulse shrinkage, expansion, pulse edge slowdown and pulse-to-pulse position and period variations. In high-speed data communications, the distortion may be so radical that the data may not be reliably recaptured. To improve on the reliability of data transmission, it has been common to employ a pulse edge detector as illustrated in FIG. 3. In particular, a D-type flip-flop L3 was added as a pulse edge detector for receiving the asynchronous signal on lead 11. As illustrated particularly in FIG. 4, the asynchronous signal may be of variable width and position, due to external factors, including transmission. NAND gate 32 receive the outputs from the Q output of each of the flip-flops L1, L2 and L3 to provide a signal output to the reset inputs of flip-flops L1 and L3.

Figure 4:
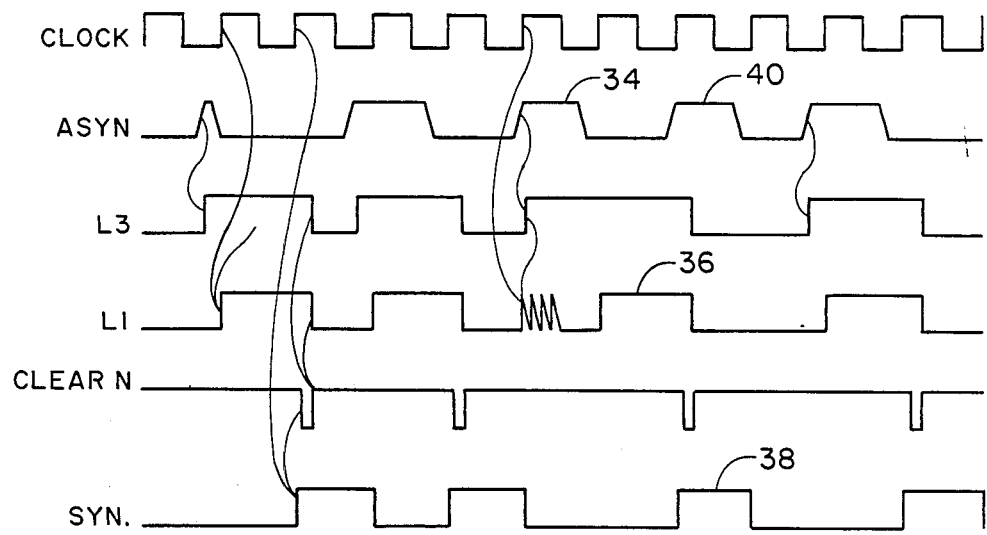
FIG. 4 is a diagram of waveforms useful in explaining the operation of the apparatus illustrated in FIG. 3.

In operation of the apparatus illustrated in FIG. 3, and with reference to FIG. 4, when the asynchronous signal on lead 11 goes high to the clock input of flip-flop L3, the Q output of flip-flop L3 is forced high so that upon the next rising edge of a clock pulse on lead 10 the Q output of L1 goes high. Upon the rising edge of the next successive clock pulse, with L1 high, L2 goes high to force the synchronous output high. Since all the flip-flops, L1, L2 and L3 are high, NAND gate 32 operates to provide a low signal reset pulse to flip-flops L1 and L3. With the Q output of flip-flop L1 now in a low state, the next rising edge of the clock signal will reset flip-flop L2 to force the synchronous signal low. As described in connection with the circuit illustrated in FIG. 1, a metastable condition can exist. When the clock and the asynchronous signals are so close that flip-flop L3 is forced to a high condition at about the same time that the leading edge of a synchronous clock signal goes high, a risk of metastability exists. Thus, as in the case of the apparatus illustrated in FIG. 1, if the L1 flip-flop ultimately seeks a low stable state, it will not respond to the asynchronous data pulse 34 until the next rising clock pulse to set flip-flop L1 high at 36. Synchronous pulse 38 is derived from the L1 output pulse 36 which in turn is derived from the asynchronous pulse 34. However, as illustrated in FIG. 4, the next asynchronous clock 40 has occurred while pulse 36 was high. Due to the already high condition of flip-flop L3, the pulse 40 is ignored, and the synchronous signal output does not include a pulse derived from the asynchronous pulse 40. Hence, data is lost. (While a higher clock frequency might seemingly enable recovery of the otherwise lost asynchronous pulse, higher frequencies also create other problems, including increased incidents of error due to metastability.)

Figure 5:
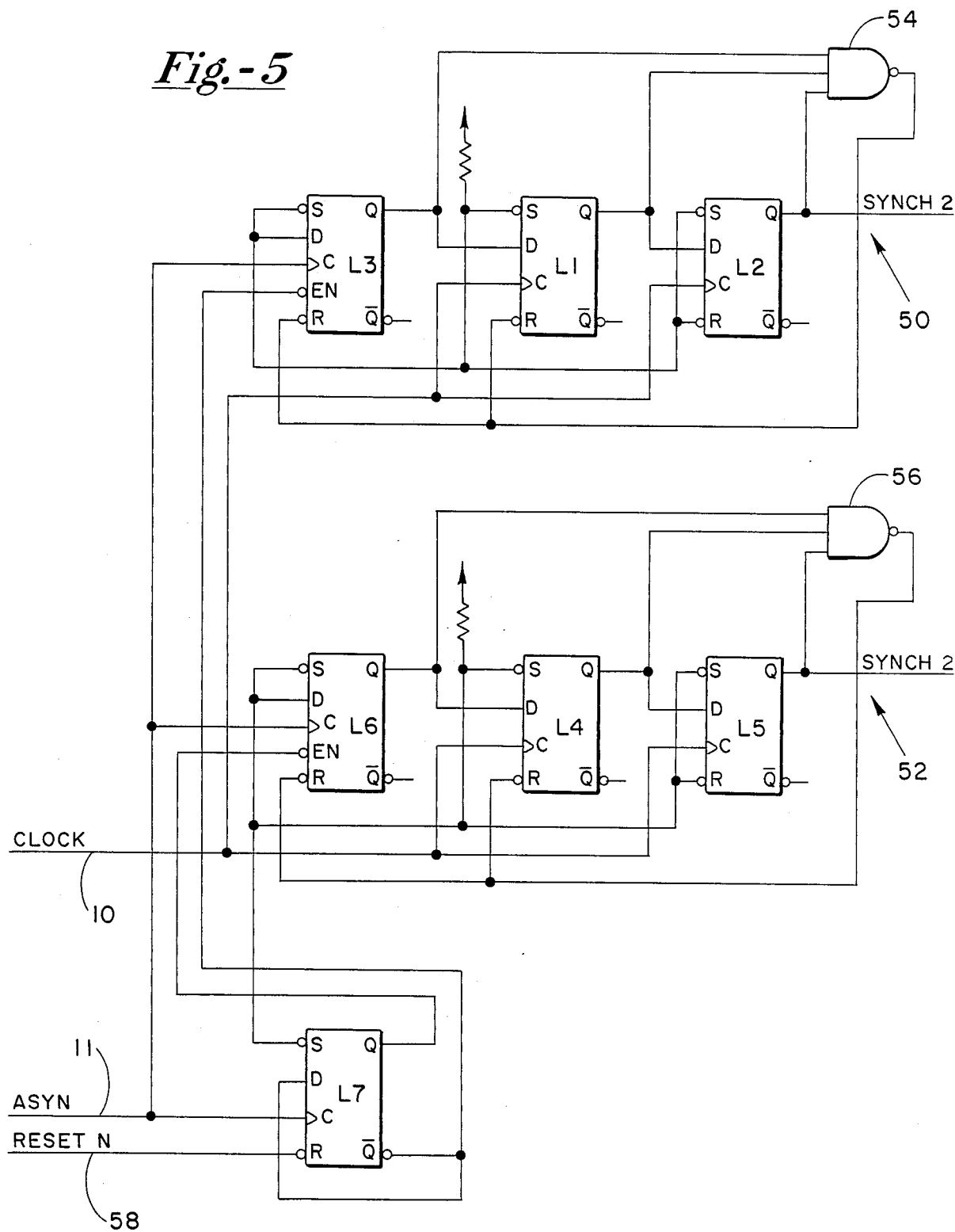
FIG. 5 is a block circuit diagram of the metastable prevent circuit in accordance with the presently preferred embodiment of the present invention.

Referring to FIG. 5, there is illustrated a metastable prevent circuit in accordance with the presently preferred embodiment of the present invention. As will be understood from the discussion of the operation of the circuit illustrated in FIG. 5, this circuit overcomes the disadvantages of the circuits illustrated in FIGS. 1 and 3. Thus, with reference to FIG. 5, there is illustrated two parallel channels, each similar to the circuit illustrated in FIG. 3. The first channel 50 comprising flip-flops L1, L2 and L3 and NAND gate 54 and the second channel 52 comprising flip-flops L4, L5 and L6 and NAND gate 56. The channels 50 and 52 are wired nearly identically to the prior art circuit illustrated in FIG. 3, with the asynchronous signal on channel 11 being applied to the clock inputs of the pulse edge detectors of gate-enabled flip-flops L3 and L6. In this case, however, flip-flops L3 and L6 have enable inputs which are connected to the Q-not and Q outputs of D-type flip-flop L7. Flip-flop L7 has its D input connected to its Q-not output, has its clock input connected to receive asynchronous signals on lead 11. The reset input of L7 is connected to receive an external reset pulse on lead 58. The Q outputs of flip-flops L2 and L5 provide separate synchronous output signals identified as Synch 1 and Synch 2.

In the operation of the circuit illustrated in FIG. 5, the initial state of flip-flop L7 is not important. However, upon receipt of reset pulse 60, flip-flop L7 is forced to a low state so that its Q output is low and its Q-not output is high. The high Q-not output of flip-flop L7 disables the gate input of flip-flop L3 while the low Q output of flip-flop L7 enables the gate input of flip-flop L6. Upon receipt of the first asynchronous pulse 62, the enabled flip-flop (L6) responds to the pulse and forces its Q output high to set pulse 64 high. Upon the next clock pulse 66, the Q output of flip-flop L4 is forced high to generate pulse 68. Upon the next clock pulse 70, Synch 2 signal is forced high at pulse 72, thereby providing the conditions for operation of NAND gate 56 to provide a reset pulse 74 to force the Q outputs of L4 and L6 low and to force low pulses 64 and 68. Synch 2 signal pulse 72 is forced low with the positive edge of the next clock pulse 82 resetting flip-flop L2.

Asynchronous pulse 62 also sets flip-flop L7 so that the Q output of flip-flop L7 is high to disable flip-flop L6 and the the Q-not output of flip-flop L7 is low to enable flip-flop L3. As a result, upon the next asynchronous pulse 76, flip-flop L3 is forced high to produce a Q output pulse 78 so that clock pulse 70 forces flip-flop L1 high at pulse 80. At the leading edge of the next clock pulse 82, pulse 84 of Synch 1 signal is generated, and NAND gate 54 provides the reset pulse 86 to reset flip-flops: L1 and L3 to force low pulses 78 and 80. Synch 1 pulse 84 will be forced low at the next clock pulse. The asynchronous pulse 76 also serves to reset flip-flop L7 to force the Q-not output of flip-flop L7 high and the Q output of flip-flop L7 low. Hence, the circuit is permitted to begin a fresh cycle with successive asynchronous pulses.

Figure 6:
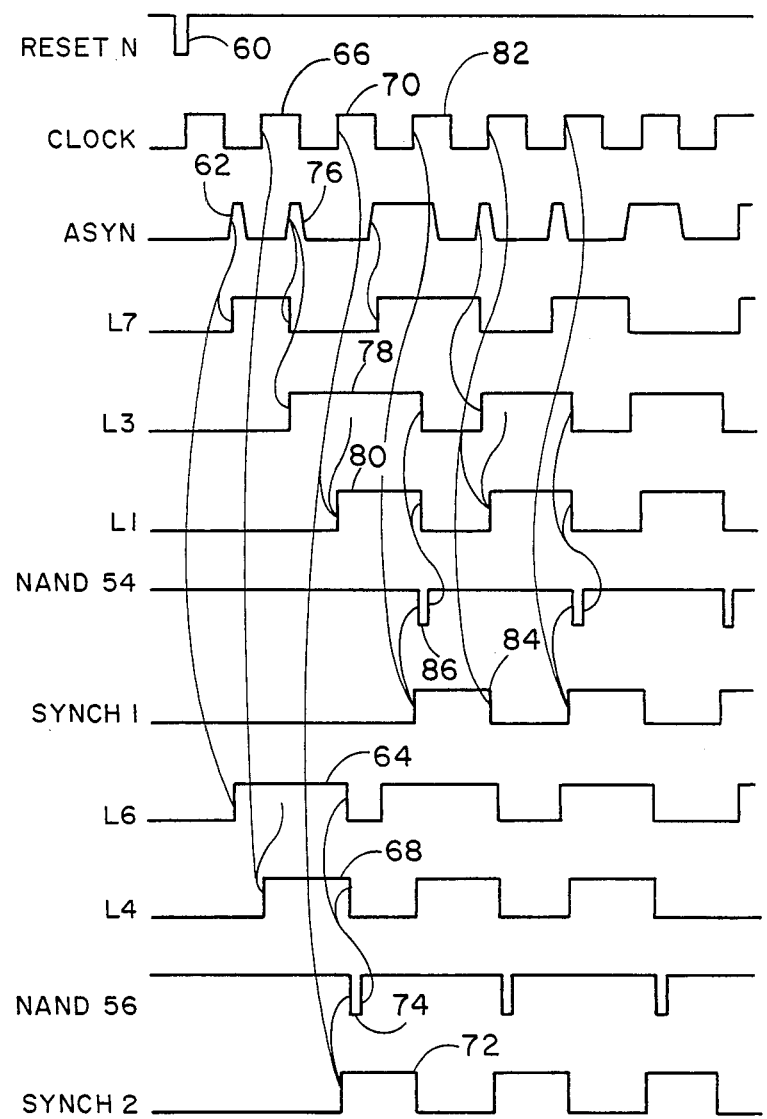
FIG. 6 is a diagram of waveforms useful in explaining the operation of the apparatus illustrated in FIG. 5.

The Synch 1 and Synch 2 signals in FIG. 6 may be processed, such as through enable gates of subsequent circuitry, to utilize the now synchronous pulses 72 and 84 and any digital information contained in or accompanying the pulses. Such successive circuitry might, for example, be responsive to the sequence in which the synchronous pulses are presented to maintain the same sequence as the corresponding asynchronous pulses were received.

Noteworthy, flip-flop L7 operates as a two position shift register with its Q and Q-not outputs enabling the separate edge formers of flip-flops L3 and L6. As a result, each channel 50 and 52 operates to synchronize the asynchronous data for alternate pulses of asynchronous data on line 11. The channels are enabled and the clock signals are settled before an asynchronous pulse is to be processed by the channel. The result is that metastable conditions in either channel will become stabilized before the channel is called upon to again detect an asynchronous data pulse. Thus, the present invention provides an effective circuit for eliminating the effects of metastable conditions in asynchronous pulse recovery.

Figure 7:
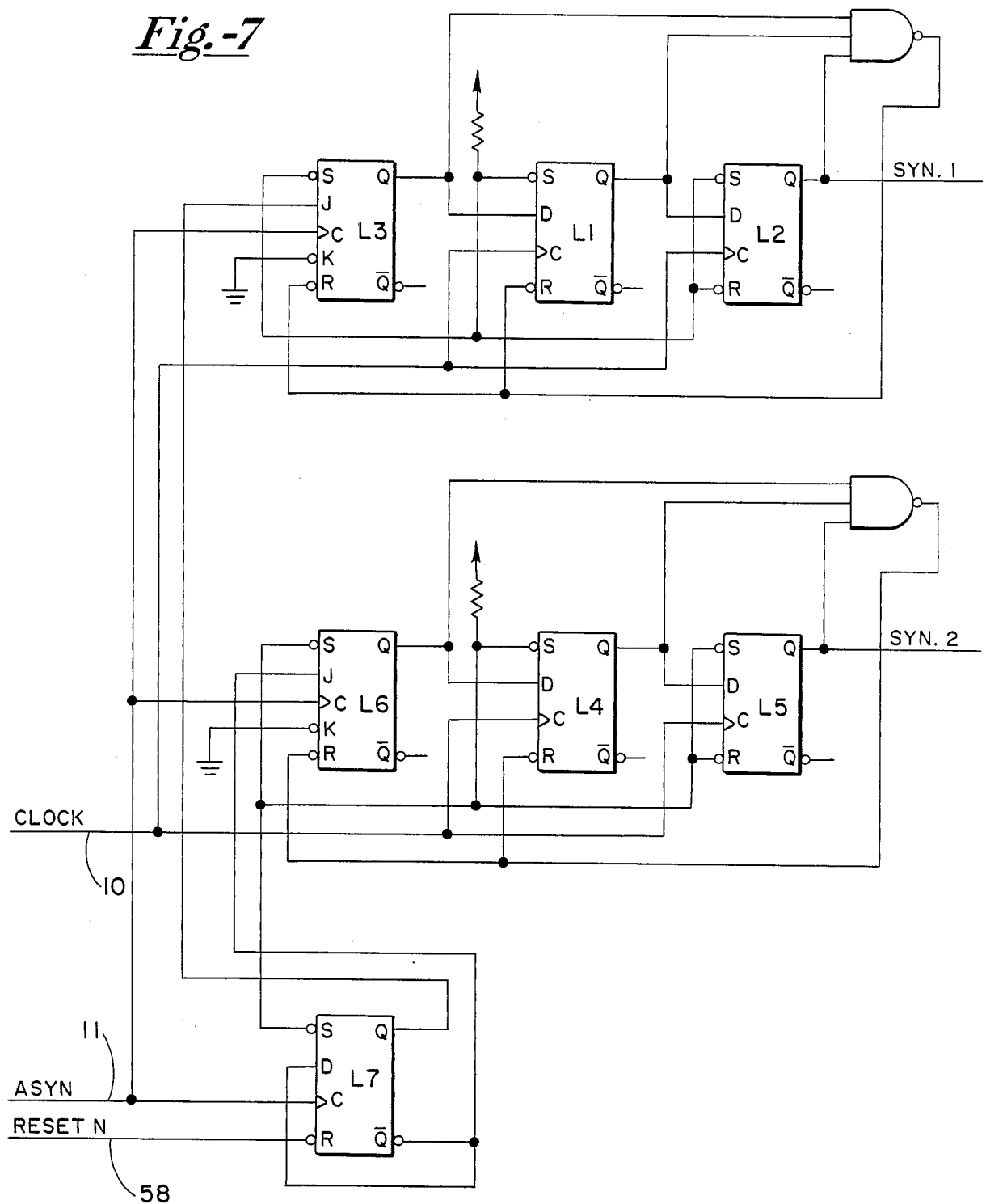
FIGS. 7 and 8 are illustrations of metastable prevent circuits in accordance with modifications of the present invention.
Figure 8:
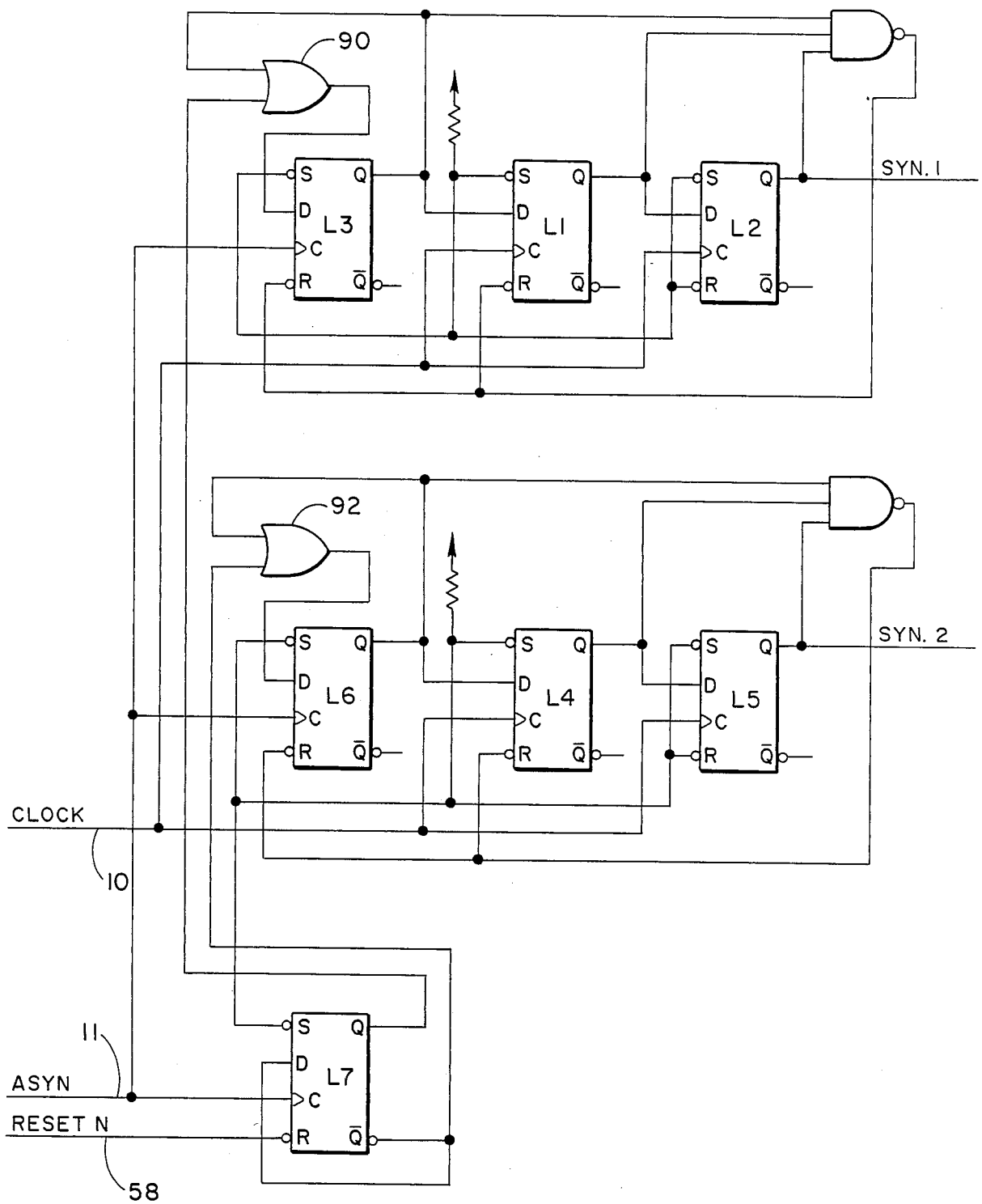

FIGS. 7 and 8 illustrate modifications to the present invention employing different types of pulse edge detectors L3 and L6. Particularly, in FIG. 7, instead of an enabling type of D-type flip-flop L3 and L6, as in FIG. 5, the flip-flops L3 and L6 in FIG. 7 are J-K flip-flops, having their K inputs grounded and their J inputs connected to the Q and Q-not outputs of the shift register formed by flip-flop L7. In FIG. 8, standard D-type flip-flops are employed with the Q and Q-not outputs of shift register flip-flop L7 operating through OR gates 90 and 92 to the D inputs of the respective flip-flops L3 and L6. A second input for OR gates 90 and 92 are taken from the respective Q outputs of the respective flip-flops. The circuits illustrated in FIGS. 7 and 8 operate in essentially the same manner as the circuit illustrated in FIG. 5, and need not be further explained.

The present invention thus provides apparatus for effectively eliminating metastable conditions in data recovery circuits which synchronize asynchronous data signals. The apparatus is effective in operation and use, and enables recovery at high data speeds.

This invention is not to be limited by the embodiments shown in the drawings and described in the description, which are given by way of example and not of limitation, but only in accordance with the scope of the appended claims.

What is claimed is:

1. A metastable prevent circuit comprising, in combination: an input for receiving an asynchronous signal containing asynchronous pulses; a plurality of circuit means each connected to said input and to a source of synchronous clock signal and each operable to synchronize asynchronous pulses to said clock signal; and shift means connected to said input and responsive to said asynchronous signal for operating successive ones of said circuit means.

2. Apparatus according to claim 1 wherein there are two circuit means, and said shift means comprises a bistable means.

3. A metastable prevent circuit comprising, in combination, a plurality of circuit means each operable to synchronize asynchronous pulses to asynchronous clock signal, each of said circuit means comprising a pulse edge detector responsive to an asynchronous pulse to produce an asynchronous output, and bistable circuit means responsive to said asynchronous output and to a clock pulse of said clock signal to produce a synchronous pulse; and shift means responsive to an asysnchronous signal containing successive ones of said a synchronous pulses to operate successive ones of the pulse edge detector means of said plurality of circuit means to respond to respective ones of said asynchronous pulses.

4. Apparatus according to claim 3 wherein each of said bistable circuit means comprises first bistable means responsive to a first clock pulse and said asynchronous output to produce a first output and second bistable means responsive to a second clock pulse following said first clock pulse and to said first output to produce a synchronous pulse.

5. Apparatus according to claim 4 wherein each of said pulse edge detector means comprises third resettable bistable means, and gate means responsive to the output of said first, second and third bistable means to reset said first and third bistable means.

6. Apparatus according to claim 5 wherein said third bistable means is a gate-enabled flip-flop having its enable input connected to an individual output of said shift means.

7. Apparatus according to claim 5 wherein said third bistable means is a J-K flip-flop having its J input connected to an individual output of said shift means.

8. Apparatus according to claim 5 wherein said third bistable means is a D-type flip-flop having its D input connected to an individual output of said shift means.

9. Apparatus according to claim 8 further including OR gate means having a first input connected to said individual output of said shift means, a second input connected to the true output of said D-type flip-flop, and an output connected to said D-input.

10. Apparatus according to claim 3 wherein there are two circuit means, and said shift means comprises a bistable means.

11. A metastable prevent circuit comprising, in combination, a plurality of circuit means each operable to synchronize asynchronous pulses to a synchronous clock signal, each of said circuit means comprising first bistable means responsive to a first clock pulse of said clock signal and an asynchronous pulse to produce a first output and second bistable means responsive to a second clock pulse following first said clock pulse and to said first output to produce a synchronous pulse; and shift means responsive to an asynchronous signal containing successive ones of said asynchronous pulses to operate successive ones of the circuit means to respond to respective ones of said asynchronous pulses.

12. Apparatus according to claim 11 wherein there are two circuit means, and said shift means comprises a bistable means.

13. A metastable prevent circuit comprising: first shift responsive to successive asynchronous pulses of an asynchronous signal to provide alternate first and second enable signals; and first and second channels for synchronizing asynchronous pulses to clock pulses of a synchronous clock signal, said first and second channels each comprising:

first bistable means having a clock input connected to receive said asynchronous signal and a further input connected to receive a respective first or second enable signal, said first bistable means providing a first output signal in response to an asynchronous pulse and the respective enable signal, second bistable means having an input connected to receive said first output signal and a clock input connected to receive said synchronous clock signal, said second bistable means providing a second output signal in response to a first clock pulse of said clock signal and said first output signal, and third bistable means having an input connected to receive said second output signal and a clock input connected to receive said synchronous clock signal, said third bistable means providing a third output signal in response to a second clock pulse following said first clock pulse and to said second output signal, said third output signal comprising output pulses synchronous with said clock signal, each output pulse corresponding to an asynchronous pulse responded to by said first bistable means.

14. Apparatus according to claim 13 further including, in each channel, gate means responsive to said first, second and third output signals to reset said first and second bistable means, said third bistable means being reset by a third clock pulse following said second clock pulse.

15. Apparatus according to claim 13 wherein said shift means comprises a flip-flop having a clock input connected to receive said asynchronous signal, and having a first output connected to the further input of the first bistable means of said first channel and a second output connected to the further input of the first bistable means of said second channel.

16. Apparatus according to claim 15 further including, in each channel, gate means responsive to said first, second and third output signals to reset said first and second bistable means, said third bistable means being reset by a third clock pulse following said second clock pulse.

17. Apparatus according to claim 16 wherein each of said first bistable means is a gate-enabled flip-flop and said further input is the enable input of said flip-flop.

18. Apparatus according to claim 16 wherein each of said first bistable means is a J-K flip-flop and said further input is the J input of said flip-flop.

19. Apparatus according to claim 16 wherein each of said first bistable means is a D-type flip-flop and said further input is the D input of said flip-flop.

20. Apparatus according to claim 19 further including, in each channel, an OR gate having a first input connected to the respective output of said shift means, a second input connected to the output of said D-type flip-flop, and an output connected to said D input.

21. Apparatus according to claim 15 wherein each of said first bistable means is a gate-enabled flip-flop and said further input in the enable input of said flip-flop.

22. Apparatus according to claim 15 wherein each of said first bistable means is a J-K flip-flop and said further input is the J input of said flip-flop.

23. Apparatus according to claim 15 wherein each of said first bistable means is a D-type flip-flop and said further input is the D input of said flip-flop.

24. Apparatus according to claim 23 further including, in each channel, an OR gate having a first input connected to the respective output of said shift means, a second input connected to the output of said D-type flip-flop, and an output connected to said D input.

* * * * *